United States Patent
Sung

(10) Patent No.: US 11,417,839 B2
(45) Date of Patent: Aug. 16, 2022

(54) MEMORY DEVICE, MEMORY INTEGRATED CIRCUIT AND MANUFACTURING METHOD THEREOF

(71) Applicant: Taiwan Semiconductor Manufacturing Company, Ltd., Hsinchu (TW)

(72) Inventor: Fu-Ting Sung, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 143 days.

(21) Appl. No.: 17/026,315

(22) Filed: Sep. 21, 2020

(65) Prior Publication Data

US 2022/0093857 A1    Mar. 24, 2022

(51) Int. Cl.
*H01L 45/00* (2006.01)
*H01L 27/24* (2006.01)

(52) U.S. Cl.
CPC ...... *H01L 45/1253* (2013.01); *H01L 27/2436* (2013.01); *H01L 27/2463* (2013.01); *H01L 45/08* (2013.01); *H01L 45/1233* (2013.01); *H01L 45/146* (2013.01); *H01L 45/147* (2013.01); *H01L 45/1616* (2013.01); *H01L 45/1675* (2013.01)

(58) Field of Classification Search
CPC ............ H01L 45/1253; H01L 27/2436; H01L 27/2463
See application file for complete search history.

(56) References Cited

U.S. PATENT DOCUMENTS

| | | |
|---|---|---|
| 2006/0076641 A1 | 4/2006 | Cho et al. |
| 2016/0365512 A1 | 12/2016 | Sung et al. |
| 2018/0358070 A1 | 12/2018 | Song et al. |
| 2020/0105343 A1 | 4/2020 | Tu et al. |
| 2020/0106013 A1 | 4/2020 | Strutt et al. |

OTHER PUBLICATIONS

"Office Action of Taiwan Counterpart Application", dated Aug. 25, 2021, p. 1-p. 8.

*Primary Examiner* — Marvin Payen
(74) *Attorney, Agent, or Firm* — JCIPRNET

(57) ABSTRACT

A memory device, a memory integrated circuit and a manufacturing method of the memory device are provided. The memory device includes a composite bottom electrode, a top electrode and a resistance variable layer disposed between the composite bottom electrode and the top electrode. The composite bottom electrode includes a first bottom electrode and a second bottom electrode disposed over the first bottom electrode. A sidewall of the second bottom electrode is laterally recessed from sidewalls of the first bottom electrode layer and the resistance variable layer.

20 Claims, 15 Drawing Sheets

MEMORY DEVICE, MEMORY INTEGRATED CIRCUIT AND MANUFACTURING METHOD THEREOF

BACKGROUND

Many modern electronic devices contain electronic memory configured to store data. Electronic memory may be volatile memory or non-volatile memory. Volatile memory stores data while it is powered, whereas non-volatile memory is able to store data even if power is removed. Resistive random access memory (RRAM) is one promising candidate for next generation non-volatile memory technology due to its simple structure and its compatibility with CMOS logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
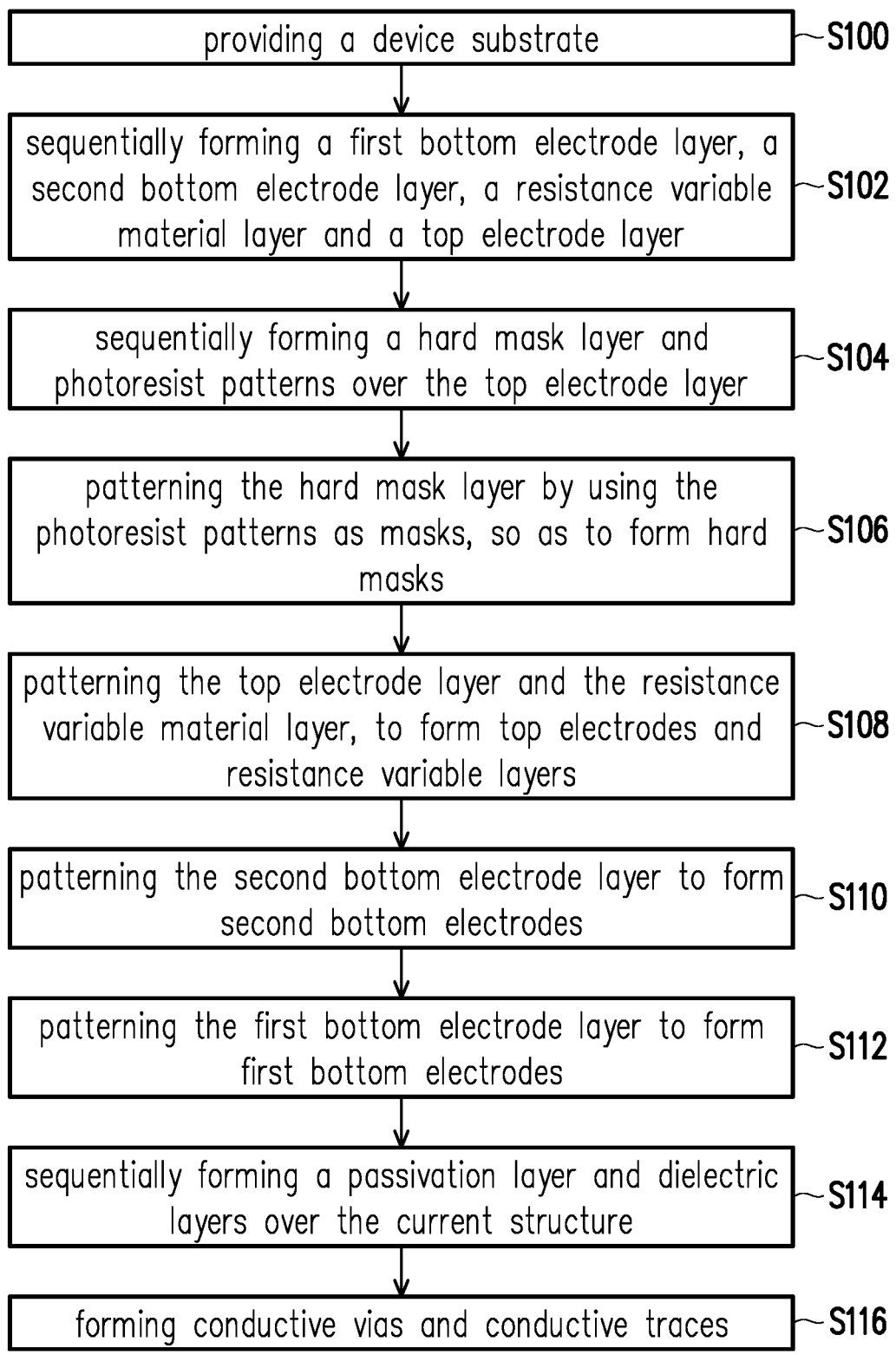
FIG. 1 is a flow diagram illustrating a manufacturing method of a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

FIG. 1 is a flow diagram illustrating a manufacturing method of a memory device according to some embodiments of the present disclosure. FIG. 2A through FIG. 2I are schematic cross-sectional views of structures at various stages during the manufacturing method of the memory device as shown in FIG. 1. In some embodiments, the manufacturing method of the memory device includes the following steps.

Figure 2A:
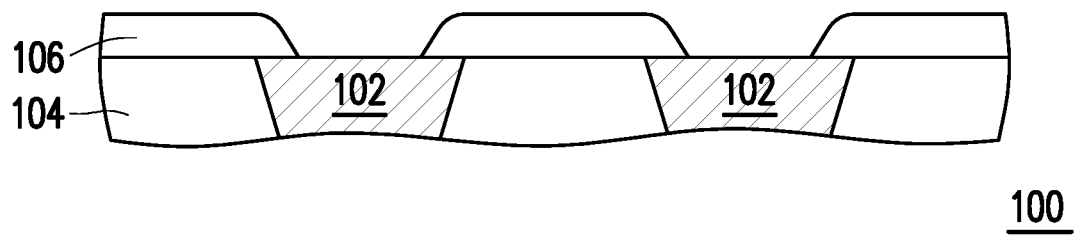
FIG. 2A through FIG. 2I are schematic cross-sectional views of structures at various stages during the manufacturing method of the memory device as shown in FIG. 1.

Referring to FIG. 1 and FIG. 2A, step S100 is performed, and a device substrate 100 is provided. In some embodiments, the device substrate 100 is a semiconductor wafer or a semiconductor-on-insulator (SOI) wafer, which is preformed with a plurality of electronic devices (not shown) and interconnections (partially shown in FIG. 2A) over the electronic devices. It should be noted that, only a top portion of the interconnections including conductive traces 102 is depicted in FIG. 2A, whereas other portions of the interconnections as well as the electronic devices are omitted for conciseness. The electronic devices may include active devices and/or passive devices. For instance, the active devices may include field effect transistors, diodes, the like or combinations thereof, whereas the passive devices may include resistors, capacitors, the like or combinations thereof. In addition, the interconnections may include a combination of conductive traces and conductive vias. The electronic devices and interconnections formed in the device substrate 100 and the structures to be formed over the device substrate 100 in the following steps constitute an integrated circuit, such as a memory integrated circuit. In some embodiments, the memory integrated circuit is a resistive random access memory (RRAM) integrated circuit. As shown in FIG. 2A, the top portion of the interconnections includes the conductive traces 102, which are laterally spaced apart from one another. A material of the conductive traces 102 may include Al, Cu, Ti, TiN, Ta, TaN, W, the like or combinations thereof. In addition, the conductive traces 102 may be formed in a dielectric layer 104. A material of the dielectric layer may include silicon oxide, silicon nitride, silicon oxynitride, a low-k dielectric material (e.g., a dielectric material having a dielectric constant of about 1.5 or less), the like or combinations thereof. In some embodiments, top surfaces of the conductive traces 102 are substantially coplanar with a top surface of the dielectric layer 104. Moreover, a passivation pattern 106 may be disposed over the conductive traces 102 and the dielectric layer 104. The passivation pattern 106 has openings 106a respectively exposing a portion of the underlying conductive trace 102. The memory units MU (as shown in FIG. 2G) to be formed in the following steps may extend into these openings 106a, in order to be electrically connected with the conductive traces 102. A material of the passivation layer 104 may include silicon carbide, silicon oxynitride, silicon oxycarbide, silicon nitride, the like or combinations thereof.

Figure 2B:
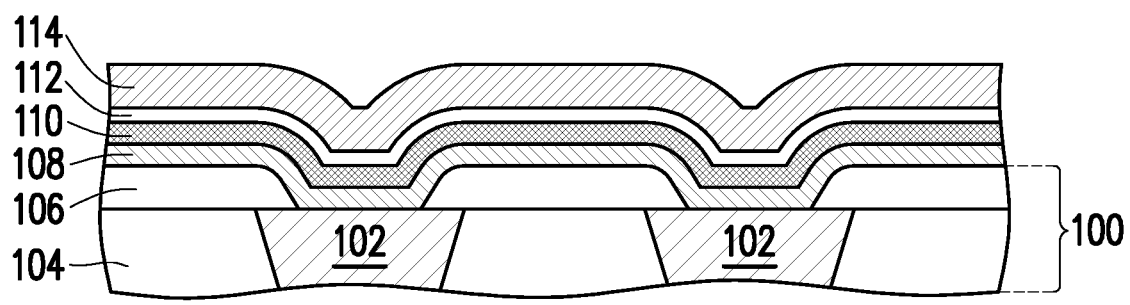

Referring to FIG. 1 and FIG. 2B, step S102 is performed, and a stack of bottom electrode layers 108 and 110, a resistance variable material layer 112 and a top electrode layer 114 are sequentially formed over the device substrate 100. In some embodiments, the bottom electrode layers 108 and 110, the resistance variable material layer 112 and the top electrode layer 114 are conformally formed over the device substrate 100. As such, at least the bottom electrode layers 108 and 110 extend into the openings 106a (as shown in FIG. 2A), and top surfaces of the bottom electrode layers 108 and 110, the resistance variable layer 112 and the top electrode layer 114 may be recessed at locations corresponding to the openings 106a. In addition, in some embodiments, the bottom electrode layer 110 has a sufficient etching selectivity with respect to the resistance variable material layer 112 and the top electrode layer 114, and patterning of the bottom electrode layer 110 and patterning of the resistance variable material layer 112 and the top electrode layer 114 can be performed in different steps by selecting appropriate etchants (as shown in FIG. 2E and FIG. 2F). Similarly, the bottom electrode layer 110 may also have a sufficient etching selectivity with respect to the bottom electrode layer 108, and the bottom electrode layers 108 and 110 can be patterned in different etching steps by selecting appropriate etchants (as shown in FIG. 2F and FIG. 2G). For instance, a material of the bottom electrode layer 108 may include titanium nitride, tantalum nitride, tungsten, titanium, tantalum, the like or combinations thereof. On the other hand, a material of the bottom electrode layer 110 may include ruthenium, iridium, platinum or combinations thereof. In addition, a material of the resistance variable material layer 112 may include tantalum oxide, hafnium oxide, tantalum aluminum oxide (TaAlO), the like or combinations thereof, and a material of the top electrode layer 114 may include titanium nitride, tantalum nitride, tungsten, titanium, tantalum, the like or combinations thereof. Furthermore, a thickness of the bottom electrode layer 108 may range from 50 Å to 200 Å. A thickness of the bottom electrode layer 110 may range from 30 Å to 200 Å. A thickness of the resistance variable material layer 112 may range from 25 Å to 100 Å. A thickness of the top electrode layer 114 may range from 100 Å to 450 Å. Moreover, formation methods for the bottom electrode layers 108 and 110 as well as the top electrode layer 114 may respectively include a deposition process, such as an atomic layer deposition (ALD) process. In addition, a formation method for the resistance variable material layer 112 may include a chemical vapor deposition (CVD) process.

Figure 2C:
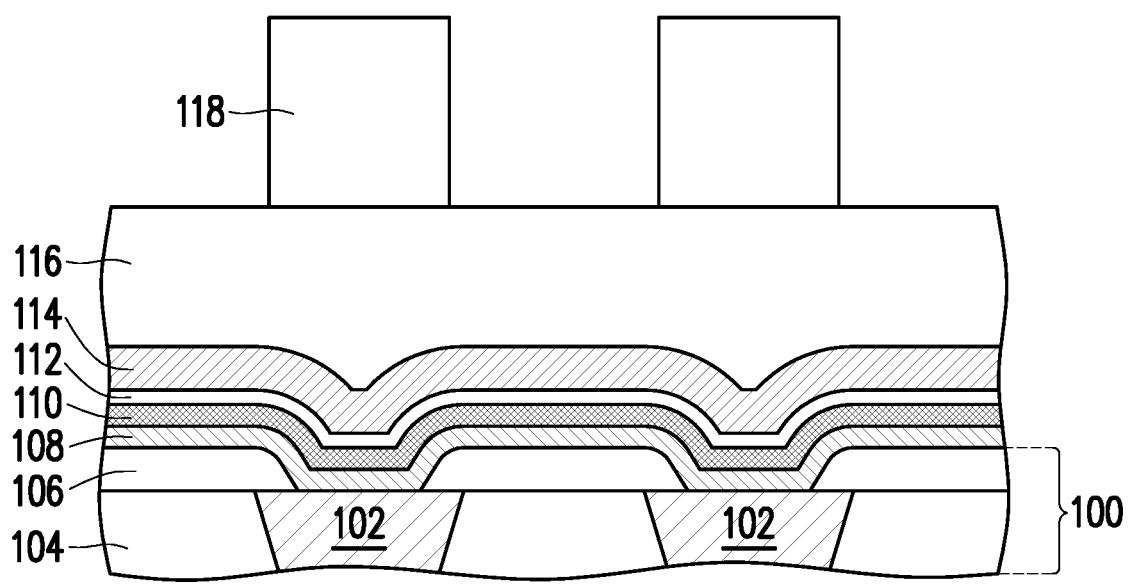
Figure 2D:
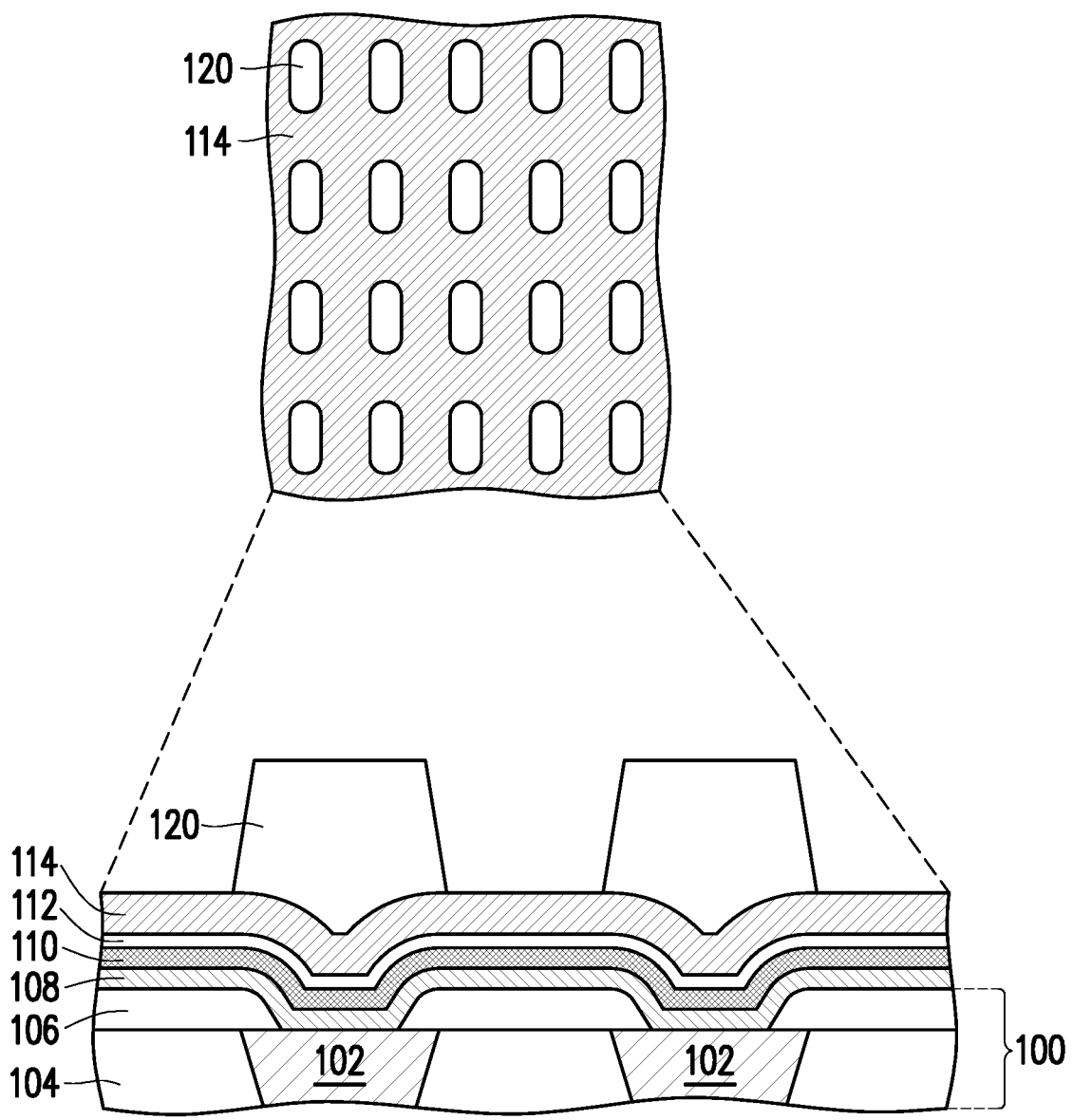
Figure 2E:
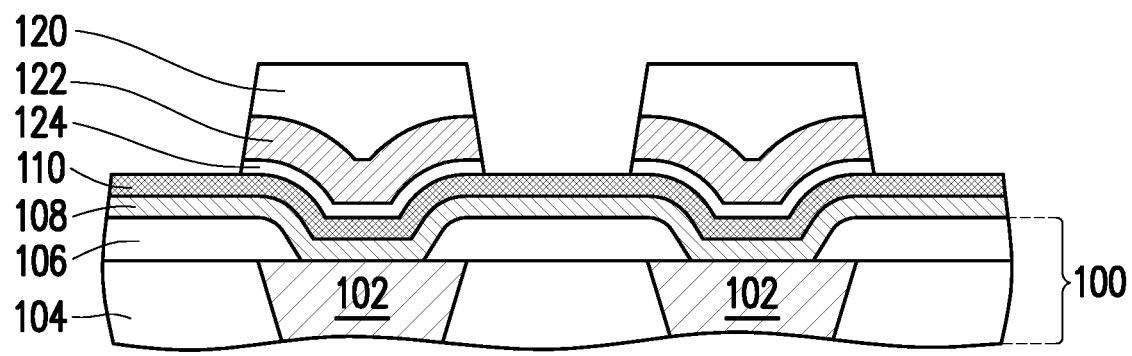
Figure 2F:
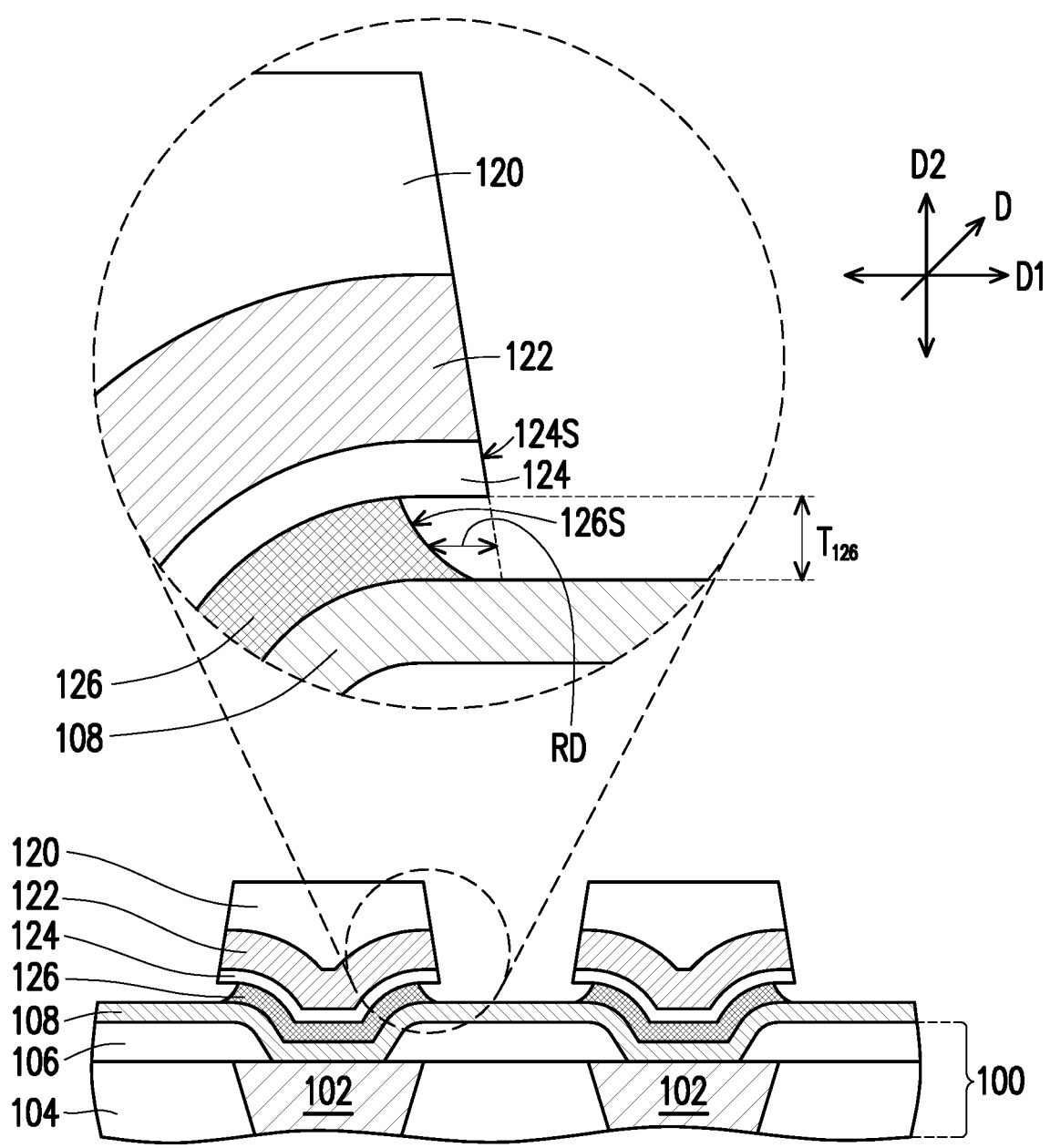
Figure 2G:
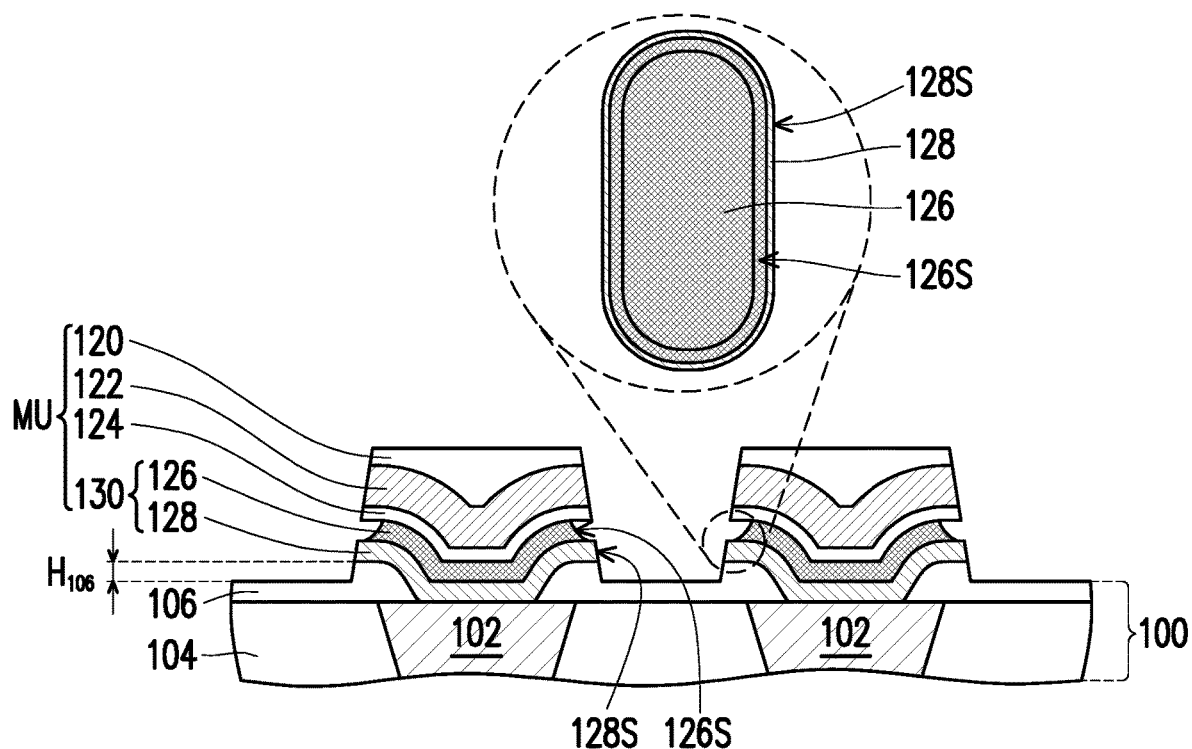

Referring to FIG. 1 and FIG. 2C, step S104 is performed, and a hard mask layer 116 and photoresist patterns 118 are sequentially formed over the top electrode layer 114. In some embodiments, the hard mask layer 116 is globally formed over the structure as shown in FIG. 2B. The hard mask layer 116 may protect the underlying layer (e.g., top electrode layer 114) from being damaged during the following patterning processes (as shown in FIG. 2D). In some embodiments, the hard mask layer 116 is formed with a sufficiently large thickness, such that the hard mask layer 116 may have a substantially flat top surface. In alternative embodiments, a planarization process (e.g., a chemical mechanical polishing (CMP) process, an etching process, a grinding process or combinations thereof) may be performed on an initially formed hard mask layer, in order to form the hard mask layer 116 having the substantially flat top surface. Moreover, in some embodiments, a bottom portion of the hard mask layer 116 may protrude into the recesses of the top surface of the top electrode layer 114. A material of the hard mask layer 116 may include silicon carbide, silicon oxynitride, silicon oxycarbide, silicon nitride, the like or combinations thereof, and a thickness of the hard mask layer 116 may range from 600 Å to 1000 Å. In addition, a formation method for the hard mask layer 116 may include a CVD process or a solution process (e.g., a spin coating process). On the other hand, the photoresist patterns 118 define location, dimension and shape of the hard masks 120 (as shown in FIG. 2D) to be formed in the following step. The photoresist patterns 118 may be made of a photosensitive material, and may have a thickness ranging from 500 Å to 2000 Å. In addition, a formation method for the photoresist patterns 118 may include a solution process (e.g., a spin coating process) and a photolithography process.

As will be described with reference to FIG. 2D through FIG. 2G, in some embodiments, the hard mask layer 116, the top electrode layer 114, the resistance variable material layer 112 and the bottom electrode layers 110 and 108 are patterned by multiple steps.

Referring to FIG. 1 and FIG. 2D, step S106 is performed, and the hard mask layer 116 is patterned to form hard masks 120 by using the photoresist patterns 108 as masks. The hard masks 120 stand on the top electrode layer 114, and may be further applied as masks for patterning the underlying top electrode layer 114, resistance variable material layer 112 and bottom electrode layers 110 and 108 in the following steps (as shown in FIG. 2E through FIG. 2G). In some embodiments, the patterning process for forming the hard masks 120 includes an anisotropic etching process. In these embodiments, widths of the hard masks 120 may gradually increase toward the underlying top electrode layer 114. In addition, the hard masks 120 may have sufficient etching selectivity with respect to the underlying top electrode layer 114, and the top electrode layer 114 may be functioned as an etching stop layer during formation of the hard masks 120. Regarding top views of the hard masks, as depicted in a region enclosed by a dash line in FIG. 2D, top view shapes of the hard masks 120 are substantially rectangular or elliptical, and the hard masks 120 are arranged as an array. However, those skilled in the art may modify the top view shapes and arrangement of the hard masks 120 according to design requirements, the present disclosure is not limited thereto. In some embodiments, after forming the hard masks 120, the photoresist patterns 108 are removed by, for example, an ashing process or a stripping process.

Referring to FIG. 1 and FIG. 2E, step S108 is performed, and the top electrode layer 114 and the resistance variable material layer 112 are patterned to form top electrodes 122 and resistance variable layers 124. In some embodiments, the patterning process for forming the top electrodes 122 and the resistance variable layers 124 uses the overlying hard masks 120 as masks, rather than using photoresist patterns that are defined by a photolithography process. In these embodiments, such patterning process can be regarded as a self-aligning patterning process. The obtained stacks, which respectively include one of the hard masks 120 and the underlying top electrode 122 and resistance variable layer 124, stand on the bottom electrode layer 110, and may be further applied as masks for patterning the bottom electrode layers 110 and 108 in the following steps (as shown in FIG. 2F and FIG. 2G). In some embodiments, the patterning process for forming the top electrodes 122 and the resistance variable layers 124 includes an anisotropic etching process. In these embodiments, widths of the above-mentioned stacks may gradually increase toward the underlying bottom electrode layer 110. In addition, the bottom electrode layer 110 may have sufficient etching selectivity with respect to the resistance variable layers 124 and the top electrodes 122, and the bottom electrode layer 110 may be functioned as an etching stop layer while forming the top electrodes 122 and the resistance variable layers 124. In some embodiments, the hard masks 120 may be thinned during formation of the top electrodes 122 and the resistance variable layer 124. For instance, the thinned hard masks 120 have a thickness ranging from 50 Å to 350 Å.

Referring to FIG. 1 and FIG. 2F, step S110 is performed, and the bottom electrode layer 110 is patterned to form bottom electrodes 126. Each of the bottom electrodes 126 lies between one of the bottom electrode layers 108 and the overlying resistance variable layer 124, and a sidewall 126S of the bottom electrodes 126 is laterally recessed and concave from a sidewall 124S of the resistance variable layer 124. In some embodiments, patterning of the bottom electrode layer 110 for forming the bottom electrodes 126 is performed by using an isotropic etching process. In those embodiments where the bottom electrode layer 108 has sufficient etching selectivity with respect to the bottom electrodes 126 (or the bottom electrode layer 110 as shown in FIG. 2E), the bottom electrode layer 108 may be functioned as an etching stop layer during the isotropic etching process. In addition, the stacks, which respectively include one of the hard masks 120 as well as the underlying top electrode 122 and resistance variable layer 124, are functioned as masks during the isotropic etching process, such that portions of the bottom electrode layer 110 not being covered by the stacks are removed. In addition, during the isotropic etching process, portions of the bottom electrode layer 110 covered by the above-mentioned stacks are further etched along a lateral direction, such that the formed bottom electrodes 126 are laterally recessed and become smaller in sizes when compared with the patterns of the overlying stacks. As shown in an enlarged view (i.e., the region enclosed by a dash line in FIG. 2F) that illustrates the sidewall 126S of one of the bottom electrodes 126 and the sidewall 124S of the overlying resistance variable layer 124, the sidewall 126S is concave from the sidewall 124S (concave from the sidewalls of the overlying stacks), and the sidewall 126S has a curved surface. From the enlarged view, the most concave part (most recessed part) of the curved sidewall 126S of the bottom electrode 126 is close to a bottom surface of the resistance variable layer 124, since portions (i.e., upper portions) of the bottom electrode layer 110 closer to the bottom surface of the resistance variable layer 124 may be exposed to etchants during the isotropic etching process longer than portions (i.e., lower portions) of the bottom electrode layer 110 more distant from the bottom surface of the resistance variable layer 124. As a result that the bottom electrode 126 has its most recessed part (i.e., most laterally etched part) close to the resistance variable layer 124, possible leakage path along the sidewalls of the top electrode 122 and the resistance variable layer 124 can be ensured not to extend to the sidewall of the bottom electrode 126. In some embodiments, a recess depth RD of the bottom electrodes 126, where the recess depth RD is measured laterally from the extension line (dotted line) along the sidewall of the overlying stack to the curved surface of the sidewall 126S, may gradually decrease from top surfaces of the bottom electrodes 126 to bottom surfaces of the bottom electrodes 126. Alternatively, the sidewalls 126S of the bottom electrodes 126 may be slanted sidewalls. The sidewalls 126S of the bottom electrodes 126 may be adjusted by tuning process parameters of the isotropic etching process, and the present disclosure is not limited thereto. In some embodiments, a recess depth RD of the bottom electrodes 126 may range from 10 Å to 400 Å, whereas a thickness $T_{126}$ of the bottom electrodes 126 may range from 50 Å to 250 Å. In those embodiments where the recess depth RD decreases downwardly, a maximum value of the recess depth RD may range from 200 Å to 400 Å, while a minimum value of the recess depth RD may range from 10 Å to 50 Å. In addition, in some embodiments, an etchant of the isotropic etching process for forming the bottom electrodes 126 is different from etchants of the anisotropic etching processes for forming the hard masks 120, the top electrodes 122 and the resistance variable layers 124 (as described with reference to FIG. 2D and FIG. 2E). For instance, the etchant of the isotropic etching process may include oxygen when a material of the bottom electrodes 126 includes ruthenium. On the other hand, the etchant of the anisotropic etching process for forming the hard masks 120 may include fluorine, carbon-fluorine compound (e.g., $CH_2F_2$, $CF_4$, $CHF_3$, or the like), carbon-sulfur compound (e.g., $SF_6$ or the like), the like or combinations thereof, and the etchant of the anisotropic etching process for forming the hard masks 120, the top electrodes 122 and the resistance variable layers 124 may include chlorine compound or bromine compound (e.g., Cl2, HBr, $BCl_3$ or the like).

Referring to FIG. 1 and FIG. 2G, step S112 is performed, and the bottom electrode layer 108 is patterned to form bottom electrodes 128. Each bottom electrode 128 and the overlying bottom electrode 126 may be collectively regarded as a composite bottom electrode 130. The composite bottom electrodes 130 are electrically connected to the electronic devices (not shown) through the interconnections (e.g., including the conductive traces 102) formed in the device substrate 100. In some embodiments, the patterning process for forming the bottom electrodes 128 includes an anisotropic etching process, which uses the overlying stacks as masks. In these embodiments, the patterning process for forming the bottom electrodes 128 can be regarded as a self-aligning process. In addition, the stacks functioned as masks may respectively include the resistance variable layer 124, the top electrode 122 and the hard mask 120. A sidewall 128S of each bottom electrode 128 may extend along an extension direction of a sidewall of the overlying one of these stacks. Since the sidewalls 126S of the bottom electrodes 126 are laterally recessed from the sidewalls of these overlying stacks, the sidewalls 126S of the bottom electrodes 126 may now laterally recessed and concave from sidewalls 128S of the underlying bottom electrodes 128 patterned by using these stacks as masks. In addition, as shown in an enlarged view (i.e., the region enclosed by a dash line in FIG. 2G) that illustrates top views of one of the bottom electrodes 126 and the underlying bottom electrode 128, in those embodiments where the recess depth of the bottom electrode 126 decreases downwardly, an area of a top surface of each bottom electrode 126 may be smaller than an area of the underlying bottom electrode 128, while an area of a bottom surface of each bottom electrode 126 may be close to or substantially identical with the area of the underlying bottom electrode 128. In some embodiments, an etchant of the anisotropic etching process for forming the bottom electrodes 128 is different from etchants of the isotropic etching process for forming the bottom electrodes 126 (as described with reference to FIG. 2F). For instance, the etchant of the anisotropic etching for forming the bottom electrodes 128 may include a halogen chemical (e.g., $CF_4$, $Cl_2$, $BCl_3$, HBr or the like), whereas the etchant of the isotropic etching for forming the bottom electrodes 126 may include oxygen when a material of the bottom electrodes 126 includes ruthenium. In some embodiments, portions of the passivation pattern 106 not covered by the above-mentioned stacks are thinned, whereas a thickness of other portions of the passivation pattern 106 lying under these stacks may remained unchanged. In these embodiments, a step height $H_{106}$ between different portions of the passivation pattern 106 may range from 20 Å to 200 Å. Moreover, in some embodiments, the hard masks 120 are also thinned during formation of the bottom electrodes 128. Those skilled in the art may adjust the thickness reduction amount of the hard masks 120 by tuning process parameter(s) of the anisotropic etching process, as long as the thinned hard masks 120 still cover the underlying top electrodes 122. The present disclosure is not limited to the thickness reduction amount of the hard masks 120.

Up to here, a plurality of memory units MU are formed over the device substrate 100. Each memory unit MU includes the top electrode 122, the composite bottom electrode 130 and the resistance variable layer 124 located between the top electrode 122 and the composite bottom electrode 130. In addition, each memory unit MU may further include the hard mask 120 disposed over the top electrode 122. In some embodiments, the memory units MU are disposed over the passivation pattern 106, and may be regarded as penetrating through the passivation pattern 106 and in electrical contact with the conductive traces 102.

Figure 2H:
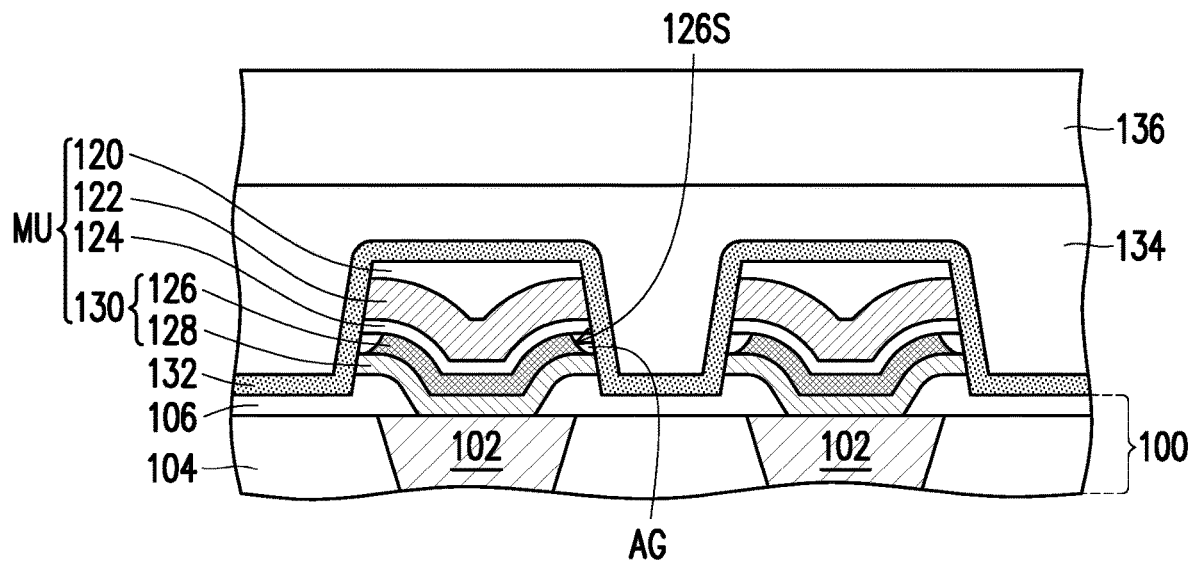

Referring to FIG. 1 and FIG. 2H, step S114 is performed, and a passivation layer 132 and dielectric layers 134 and 136 are sequentially formed over the device substrate 100 and the memory units MU. In some embodiments, the passivation layer 132 is conformally formed over the device substrate 100 and the memory units MU. In this way, exposed surfaces of the passivation pattern 106 and exposed surfaces of the memory units MU are currently covered by the passivation layer 132. In certain embodiments, the passivation layer 132 is not in physical contact with the bottom electrodes 126. In these embodiments, an air gap AG may be formed between each bottom electrode 126 and the passivation layer 132. The air gaps AG may surround the bottom electrodes 126, respectively. The dielectric layer 134 is formed over the passivation layer 132. In some embodiments, recesses respectively defined between adjacent memory units MU are filled up by the dielectric layer 134, and portions of the passivation layer 132 above the memory units MU may be covered by the dielectric layer 134. In addition, in some embodiments, a planarization process may be performed on the dielectric layer 134, such that the dielectric layer 134 may have a substantially flat top surface. The dielectric layer 136 is formed over the dielectric layer 134, and may also have a substantially flat top surface. A material of the passivation layer 132 may include silicon carbide, silicon oxynitride, silicon oxycarbide, silicon nitride, the like or combinations thereof, whereas a material of the dielectric layers 134 and 136 may include silicon oxide, a low-k dielectric material (e.g., a dielectric material having a dielectric constant of about 1.5 or less), the like or combinations thereof. In addition, a method for forming the passivation layer 132 may include a CVD process, whereas a method for forming the dielectric layers 134 and 136 may include a CVD process or a solution process (e.g., a spin coating process).

Figure 2I:
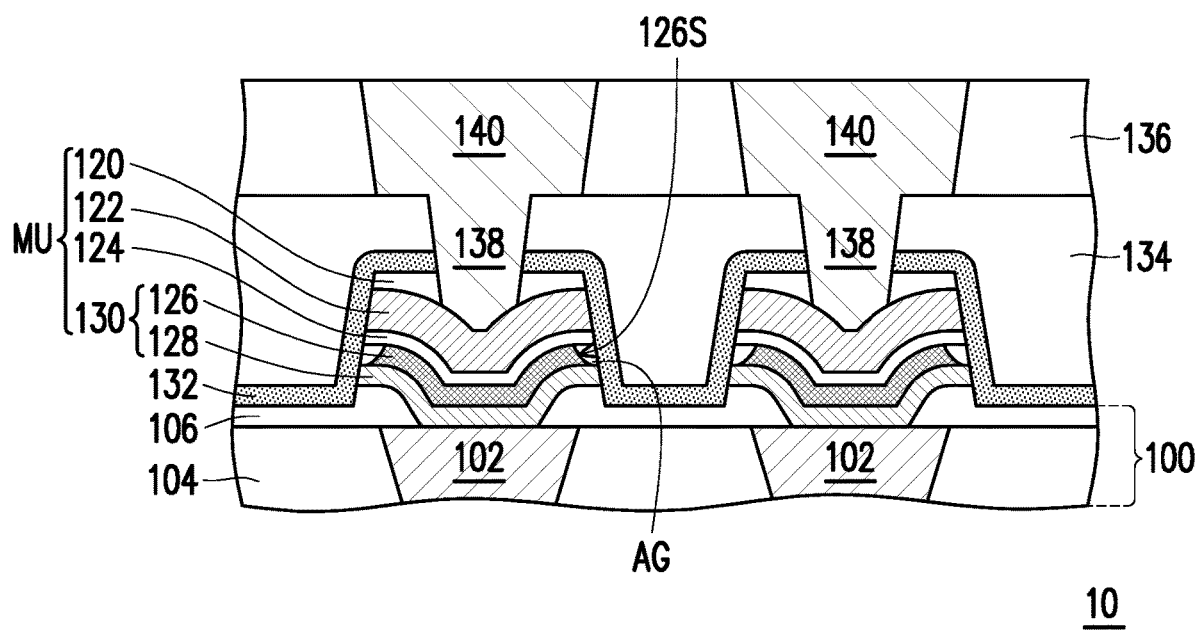

Referring to FIG. 1 and FIG. 2I, step S116 is performed, and conductive vias 138 and conductive traces 140 are formed. The conductive vias 138 penetrate the dielectric layer 134, the passivation layer 132 and the hard masks 120, so as to be electrically connected with the top electrodes 122. In some embodiments, bottom surfaces of the conductive vias 138 may protrude into the recesses at the top surfaces of the top electrodes 122. The conductive traces 140 are formed in the dielectric layer 136, and in electrical contact with the underlying conductive vias 138, respectively. In some embodiments, the conductive traces 140 are functioned as bit lines in a memory integrated circuit as exemplarily shown in FIG. 3A. In some embodiments, a material of the conductive vias 138 and the conductive traces 140 may include copper, aluminum, aluminum-copper alloy, the like or combinations thereof. In addition, in some embodiments, the conductive vias 138 and the conductive traces 140 may be formed by a dual damascene process. In these embodiments, vias and trenches are formed in the dielectric layers 134 and 136 by multiple photolithography processes and etching processes, and then a conductive material is formed into these vias and trenches by a deposition process (e.g., a PVD process), a plating process (e.g., an electroplating process or an electro-less plating process) or a combination thereof, so as to form the conductive vias 138 and conductive traces 140.

Up to here, a plurality of memory devices 10 are formed. Each memory device 10 includes one of the memory units MU, and may further include the conductive via 138 as well as the conductive traces 102 and 140 electrically connected to this memory unit MU. During a set operation (or referred as a forming process), a conductive filament (not shown) penetrating through the resistance variable layer 124 is formed, and the resistance variable layer 124 is at a low resistance state (or referred as an on-state). On the other hand, during a reset operation, the conductive filament is cut off or absent in the resistance variable layer 124, and the resistance variable layer 124 is at a high resistance state (or referred as an off-state). In some embodiments, the conductive traces 102 and 140 are configured to receive voltages and provide bias across bottom and top ends of the resistance variable layers 124, so as to perform the above-mentioned set and reset operations.

As above, the memory device 10 includes the memory unit MU, which includes the composite bottom electrode 130, the top electrode 122 and the resistance variable layer 124 sandwiched between the composite bottom electrode 130 and the top electrode 122. The composite bottom electrode 130 includes the bottom electrode 128 and the bottom electrode 126 disposed over the bottom electrode 128. The sidewall 126S of the bottom electrode 126 is laterally recessed and concave from sidewalls of other portions of the memory unit MU. As a result, an isolation distance from the top electrode 122 to the composite bottom electrode 130 along a sidewall of the memory unit MU is increased. In addition, during laterally recessing the bottom electrode 126, possible residue of a conductive material left between the top electrode 122 and the composite bottom electrode 130 may be removed. Therefore, isolation between the top electrode 122 and the composite bottom electrode 130 is improved. As compared with disposing a spacer surrounding the top electrode 122 that a pattern of the composite bottom electrode 130 would be defined by an outer contour of the surrounding spacer, the composite bottom electrode 130 according to embodiments of the present disclosure may have a smaller footprint since it is patterned by using a smaller mask which does not have the surrounding spacer. In this way, the isolation between the top electrode 122 and the composite bottom electrode 130 can be ensured without decreasing a spacing between laterally adjacent memory units MU (i.e., a spacing between laterally adjacent composite bottom electrodes 130), thus isolation between laterally adjacent memory units MU can also be improved. Furthermore, by omitting formation of the above-mentioned spacer, at least one deposition step and at least one etching step could be saved. Accordingly, a manufacturing cost is reduced.

Figure 3A:
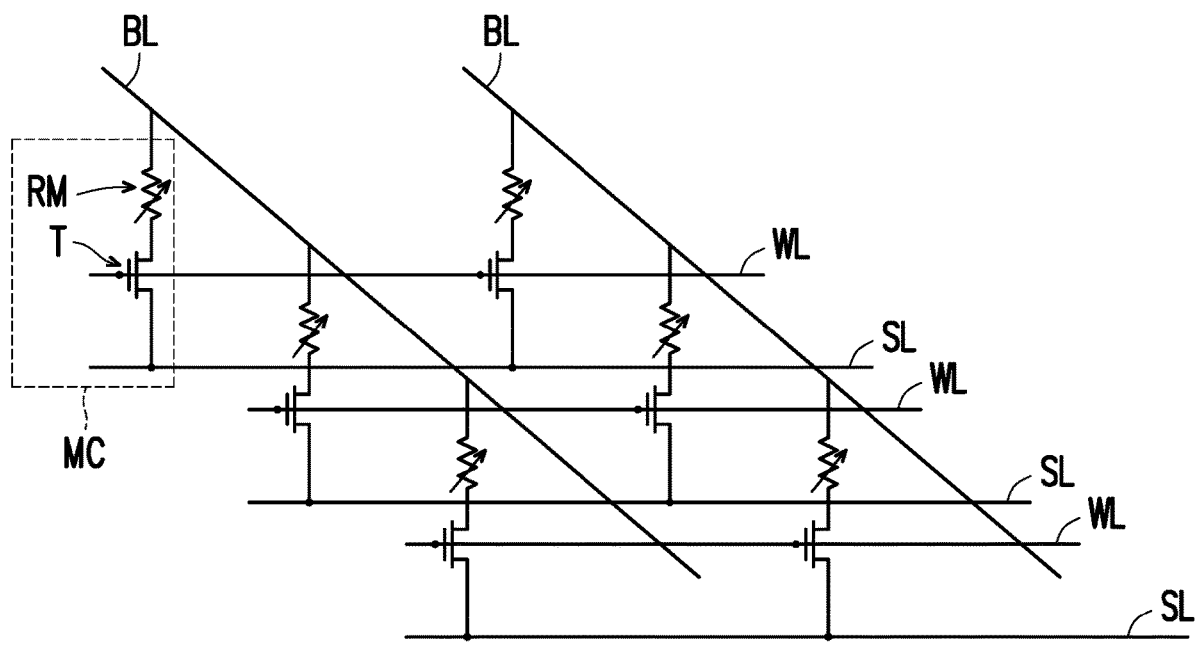
FIG. 3A is an equivalent circuit diagram illustrating a memory integrated circuit according to some embodiments of the present disclosure.

FIG. 3A is an equivalent circuit diagram illustrating a memory integrated circuit according to some embodiments of the present disclosure.

Referring to FIG. 3A, in some embodiments, each resistive memory RM and a transistor T serially connected to the resistive memory RM constitute a memory cell MC. A plurality of the memory cells MC may be arranged in an array, and constitute a memory integrated circuit 20, such as a RRAM integrated circuit. The resistive memory RM shown in FIG. 3A may be implemented by the memory device 10 as shown in FIG. 2I, and the memory unit MU of the memory device 10 as shown in FIG. 2I is depicted as a variable resistor in FIG. 3A. The transistors T can be some of the electronic devices formed in the device substrate 100 shown in FIG. 2A through FIG. 2I. A gate terminal of each transistor T is electrically connected to a word line WL, and source and drain terminals of each transistor T are electrically connected to a source line SL and the memory unit MU of one of the resistive memories RM, respectively. A row of the transistors T may share one of the word lines WL, as well as one of the source lines SL. In addition, electrical connection between the drain terminals and the memory units MU may be realized by the interconnections formed in the device substrate 100 as shown in FIG. 2A through FIG. 2I, and such interconnections may include the conductive traces 102. Moreover, the memory units MU are further electrically connected to bit lines BL, such that each memory unit MU is electrically connected between one of the transistors T and one of the bit lines BL. A column of the memory units MU may share one of the bit lines BL. In some embodiments, the bit lines BL can be implemented as the conductive traces 140 as shown in FIG. 2I.

As described above, the memory integrated circuit 20 has a "1T1R" configuration since each transistor T is electrically connected to one of the resistive memory RM. However, the memory integrated circuit of the present disclosure may be formed with other configurations including "1TNR" configuration (i.e., each transistor T is electrically connected with a plurality of resistive memories RM), "cross point" configuration (i.e., a transistor is absent in each memory cell) or the like. Those skilled in the art may modify the configuration of the memory integrated circuit according to design requirements, the present disclosure is not limited thereto.

Figure 3B:
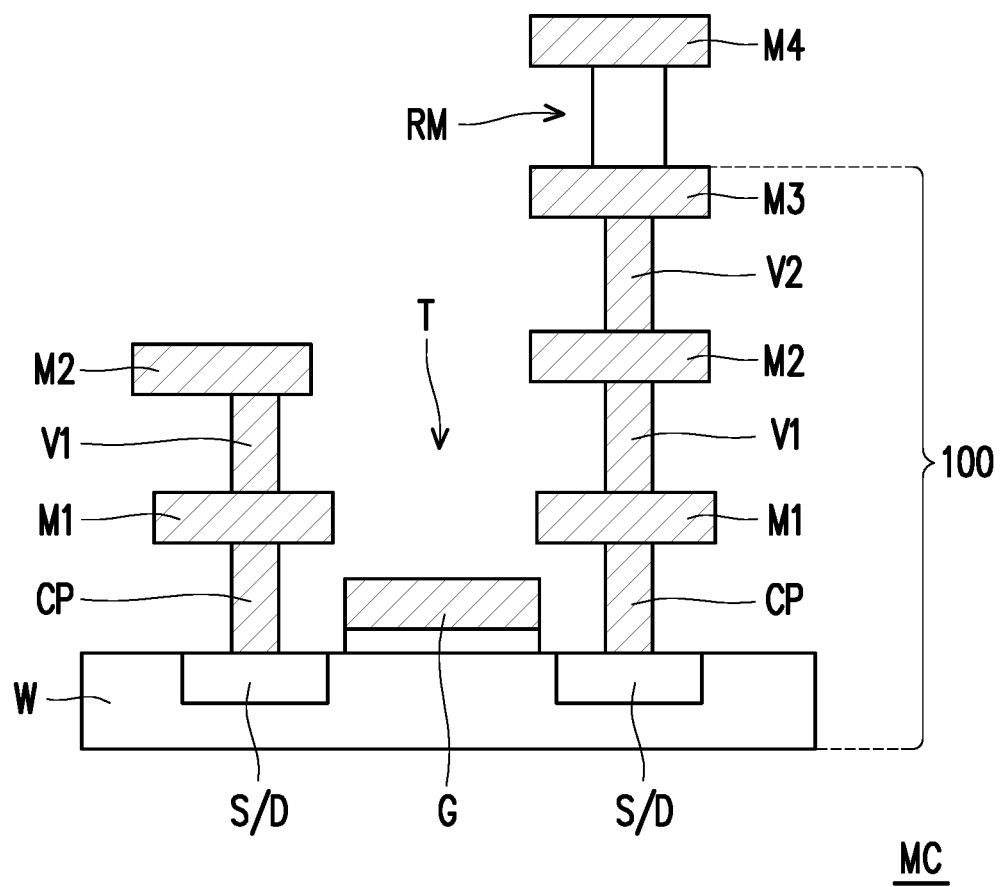
FIG. 3B is a schematic diagram illustrating one of the memory cells shown in FIG. 3A.

FIG. 3B is a schematic diagram illustrating one of the memory cells MC shown in FIG. 3A. As shown in FIG. 3B, each memory cell MC includes one of the transistors T and one of the resistive memories RM. The transistor T is formed in the device substrate 100, whereas the resistive memory RM is formed over the device substrate 100. The device substrate 100 may include a semiconductor substrate W. A gate terminal G of the transistor T is formed over the semiconductor substrate W. In some embodiments, a source terminal S and a drain terminal D of the transistor T are embedded in the semiconductor substrate W. On the other hand, the interconnections of the device substrate 100 are formed over the semiconductor substrate W, and may include contact plugs CP standing on the source terminal S and drain terminal D, as well as multiple metallization layers. The metallization layers may include conductive traces M1, M2, M3 and M4, and include conductive vias V1 and V2. The conductive traces M1, M2 M3 and M4 extend along a direction substantially parallel to a top surface of the semiconductor substrate W, and are stacked over the semiconductor substrate W by numerical order. Each of the conductive vias V1 and V2 is electrically connected between vertically adjacent conductive traces (e.g., the conductive traces M1 and M2). In some embodiments, the resistive memory RM is electrically connected between the conductive traces M3 and M4. In these embodiments, the conductive trace M4 may be functioned as a bit line BL as shown in FIG. 3A. In addition, the conductive traces M3 and M4 may be respectively implemented as the conductive traces 102 and 140 as shown in FIG. 2I, and the conductive vias 138 as shown in FIG. 2I are omitted in FIG. 3B.

Figure 4A:
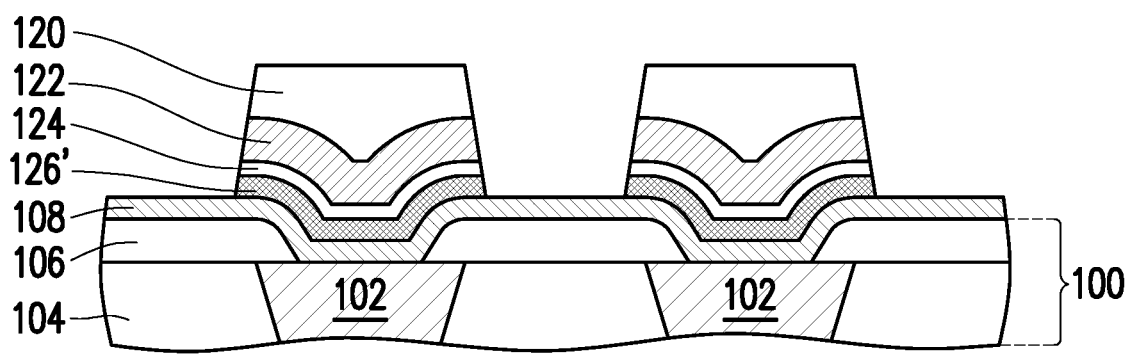
FIG. 4A through FIG. 4C are schematic cross-sectional views of structures at various stages during a manufacturing method of a memory device according to some embodiments of the present disclosure.
Figure 4B:
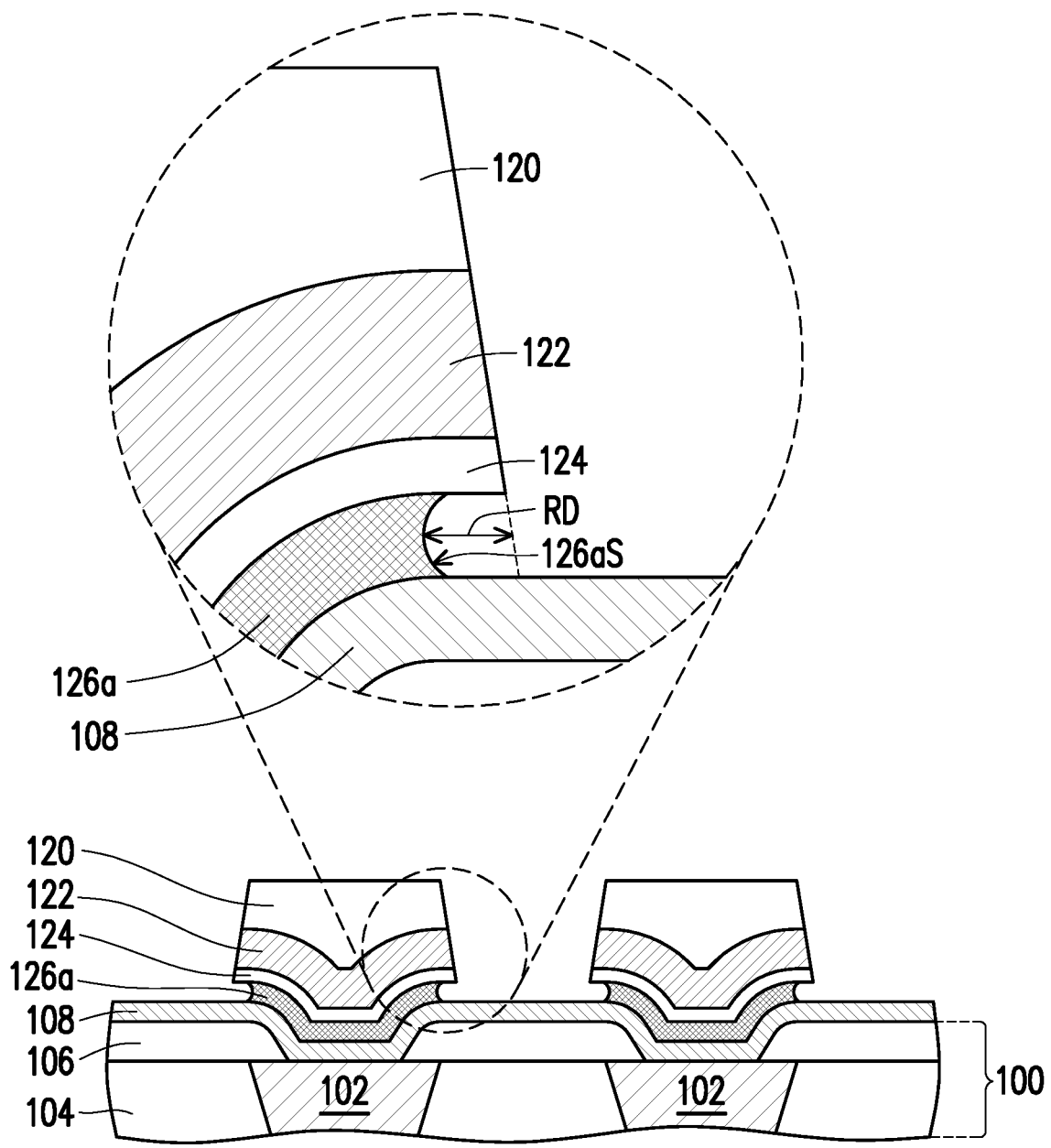
Figure 4C:
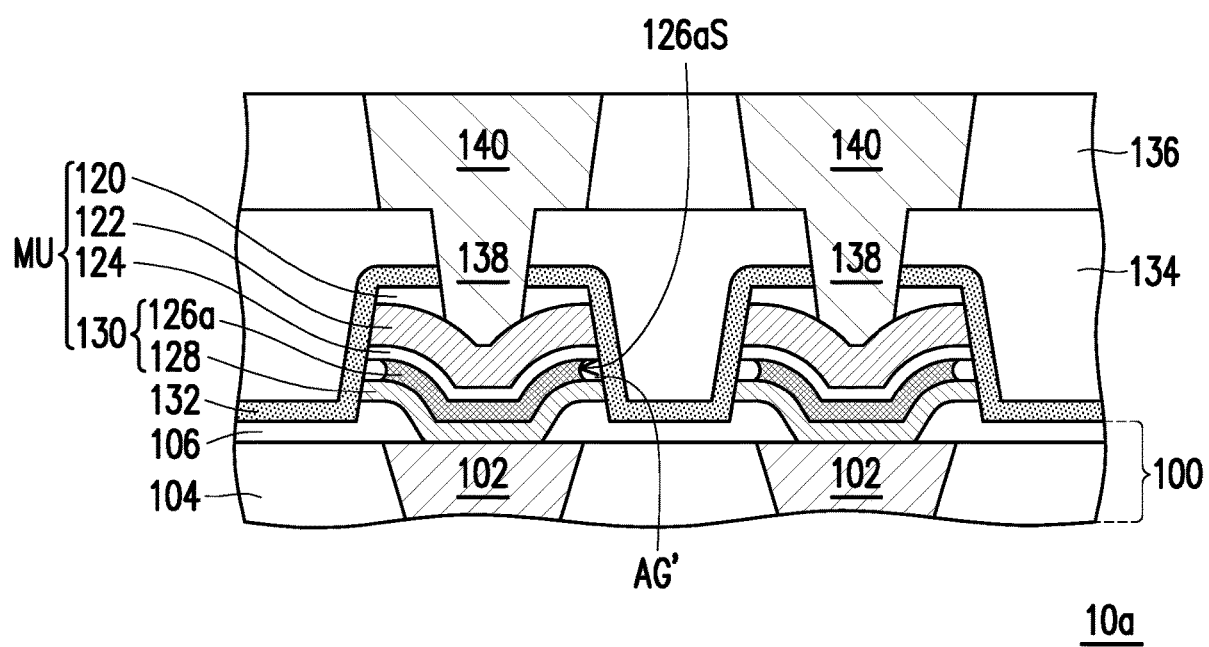

FIG. 4A through FIG. 4C are schematic cross-sectional views of structures at various stages during a manufacturing method of a memory device according to some embodiments of the present disclosure. The embodiments to be described with reference to FIG. 4A through FIG. 4C are similar to the embodiments elaborated with reference to FIG. 1 and FIG. 2A through FIG. 2I. Only the difference therebetween will be described, the same or similar parts will not be repeated again.

Referring to FIG. 1, FIG. 2D and FIG. 4A, after performing steps S100, S102, S104 and S106, the top electrode layer 114, the resistance variable material layer 112 and the bottom electrode layer 110 as shown in FIG. 2D are patterned to form the top electrodes 122, the resistance variable layers 124 and initial bottom electrodes 126'. In some embodiments, the patterning process for forming the top electrodes 122, the resistance variable layers 124 and the initial bottom electrodes 126' includes an anisotropic etching process. The hard masks 120 may be used as masks during this anisotropic etching process. In this way, portions of the top electrode layer 114, the resistance variable material layer 112 and the bottom electrode layer 110 not being covered by the hard masks 120 may be removed, whereas portions of these layers being covered by the hard masks 120 may be remained. In some embodiments, the underlying bottom electrode layer 108 may be functioned as an etching stop layer during this anisotropic etching process, and may be exposed when this anisotropic etching process is complete. Since an anisotropic etching process is used for forming the top electrodes 122, the resistance variable layers 124 and the initial bottom electrodes 126', sidewalls of these layers may not be recessed or protruded from one another. In some embodiments, sidewalls of the top electrodes 122, the resistance variable layers 124 and the initial bottom electrodes 126' are substantially coplanar with one another. An etchant used in this anisotropic etching process may be able to remove materials of the top electrode layer 114, the resistance variable material layer 112 and the bottom electrode layer 110. For instance, the etchant used in this anisotropic etching process may include argon, oxygen and a mixture of fluorine and chlorine based etchants.

Referring to FIG. 4A and FIG. 4B, the sidewalls of the initial bottom electrodes 126' are laterally recessed and concave from the sidewalls of the overlying layers, so as to form bottom electrodes 126a. In some embodiments, an isotropic etching process is used for forming the bottom electrodes 126a, and peripheral regions of the initial bottom electrodes 126' are removed. A recess depth RD of sidewalls 126aS of the bottom electrodes 126a may be controlled by adjusting process time of this isotropic etching process. As shown in an enlarged view (i.e., the region enclosed by a dash line in FIG. 4B) that illustrates the sidewall 126aS of one of the bottom electrodes 126a, a recess depth RD of the concave sidewall 126aS of each bottom electrode 126a may not be at its maximum at a topmost portion of the bottom electrode 126a (as described with reference to FIG. 2F), since substantially the whole sidewall of the bottom electrode 126a is equally exposed to the etchants. In some embodiments, the recess depth RD may be at its maximum at about half thickness of the bottom electrode 126a, and at is minimum close to top and bottom surfaces of the bottom electrode 126a. In other words, the most concave part of the sidewall 126aS of each bottom electrode 126a may be located at around a half thickness of the bottom electrode 126a. For instance, the sidewall 126aS of the bottom electrode 126a may substantially appear to be a parabolic concave surface. In addition, this parabolic concave surface may be symmetrical with respect to a substantially horizontal axis. In some embodiments, a maximum value of the recess depth RD may range from 100 Å to 400 Å, while a minimum value of the recess depth RD may range from 10 Å to 350 Å.

Subsequently, referring to FIG. 1 and FIG. 4C, steps S112, S114 and S116 are performed, and memory devices 10a are formed. The memory device 10a shown in FIG. 4C is similar to the memory device 10 as shown in FIG. 2I, except that a shape of the sidewall 126aS of each bottom electrode 126a shown in FIG. 4C is different from a shape of the sidewall 126S of each bottom electrode 126 as shown in FIG. 2I. In some embodiments, the passivation layer 132 is not in physical contact with the bottom electrodes 126a, and air gaps AG' are formed between the passivation layer 132 and the bottom electrodes 126a. In this way, an inner contour of each air gap AG' is defined by the sidewall 126aS of the corresponding bottom electrode 126a, which is recessed the most at about half thickness of the bottom electrode 126a.

Figure 5A:
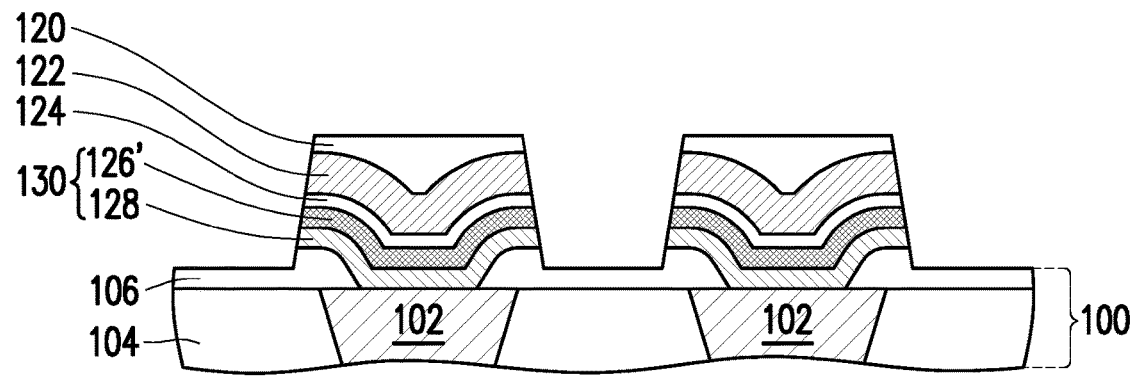
FIG. 5A and FIG. 5B are schematic cross-sectional views of structures at various stages during a manufacturing method of a memory unit shown in FIG. 4C.
Figure 5B:
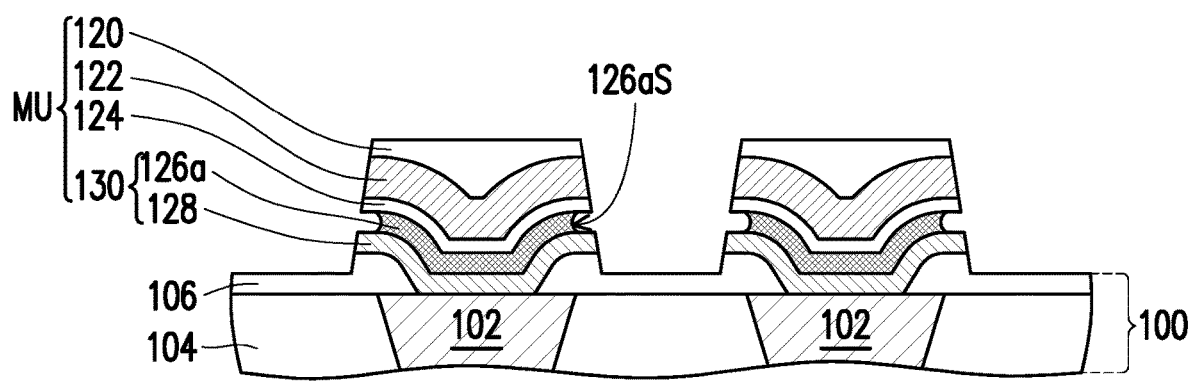

FIG. 5A and FIG. 5B are schematic cross-sectional views of structures at various stages during a manufacturing method of a memory unit shown in FIG. 4C. The embodiments to be described with reference to FIG. 5A and FIG. 5B are similar to the embodiments elaborated with reference to FIG. 4A through FIG. 4C. Only the difference therebetween will be described, the same or similar parts will not be repeated again.

Referring to FIG. 1 and FIG. 5A, after performing steps S100, S102, S104 and S106, the top electrode layer 114, the resistance variable material layer 112, the bottom electrode layer 110 and the bottom electrode layer 108 are patterned to form the top electrodes 122, the resistance variable layers 124, the initial bottom electrodes 126' and the bottom electrodes 128. In some embodiments, the patterning process for forming the top electrodes 122, the resistance variable layers 124, the initial bottom electrodes 126' and the bottom electrodes 128 includes an anisotropic etching process. The hard masks 120 may be used as masks during this anisotropic etching process. In this way, portions of the top electrode layer 114, the resistance variable material layer 112, the bottom electrode layer 110 and the bottom electrode layer 108 not being covered by the hard masks 120 may be removed, whereas portions of these layers being covered by the hard masks 120 may be remained. In some embodiments, this anisotropic etching process is stopped at the passivation pattern 106. In certain embodiments, portions of the passivation pattern 106 not covered by the hard masks 120 are thinned, whereas a thickness of other portions of the passivation pattern 106 lying under the hard masks 120 may remained unchanged. Since an anisotropic etching process is used for forming the top electrodes 122, the resistance variable layers 124, the initial bottom electrodes 126' and the bottom electrodes 128, sidewalls of these layers may not be recessed or protruded from one another. In some embodiments, sidewalls of the top electrodes 122, the resistance variable layers 124, the initial bottom electrodes 126' and the bottom electrodes 128 are substantially coplanar with one another. An etchant used in this anisotropic etching process may be able to remove materials of the top electrode layer 114, the resistance variable material layer 112, the bottom electrode layer 110 and the bottom electrode layer 108. For instance, the etchant used in this anisotropic etching process may include argon, oxygen and a mixture of fluorine and chlorine based etchants.

Referring to FIG. 5A and FIG. 5B, sidewalls of the initial bottom electrodes 126' are laterally recessed and concave from sidewalls of the overlying and underlying layers, so as to form the bottom electrodes 126a. The method for forming the bottom electrodes 126a as shown in FIG. 5B is similar to the method for forming the bottom electrodes 126a as shown in FIG. 4B, except that the bottom electrodes 126 as shown in FIG. 5B is formed after the formation of the underlying bottom electrodes 128. Accordingly, the sidewalls 126aS of the bottom electrodes 126a shown in FIG. 5B are similar to the sidewalls 126aS of the bottom electrodes 126a as shown in FIG. 4B that recess the most at about half thickness of the bottom electrodes 126a.

Subsequently, referring to FIG. 1 and FIG. 4C, steps S114 and S116 are performed, and the memory devices 10a are formed.

Figure 6A:
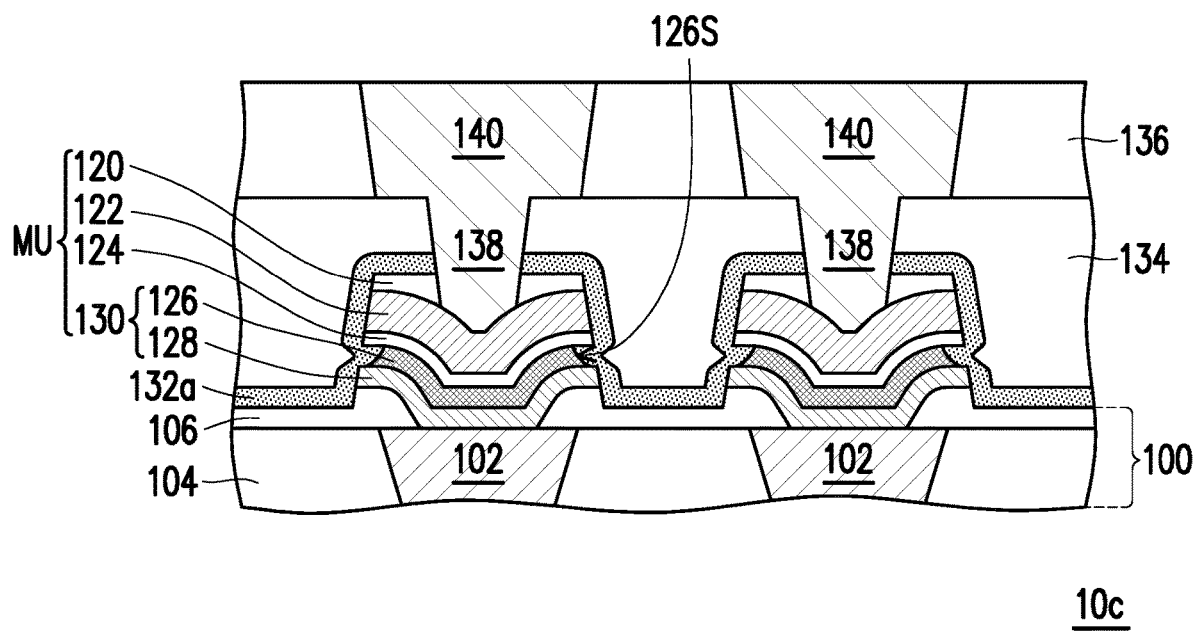
FIG. 6A and FIG. 6B are schematic cross-sectional views illustrating memory devices according to some embodiments of the present disclosure.
Figure 6B:
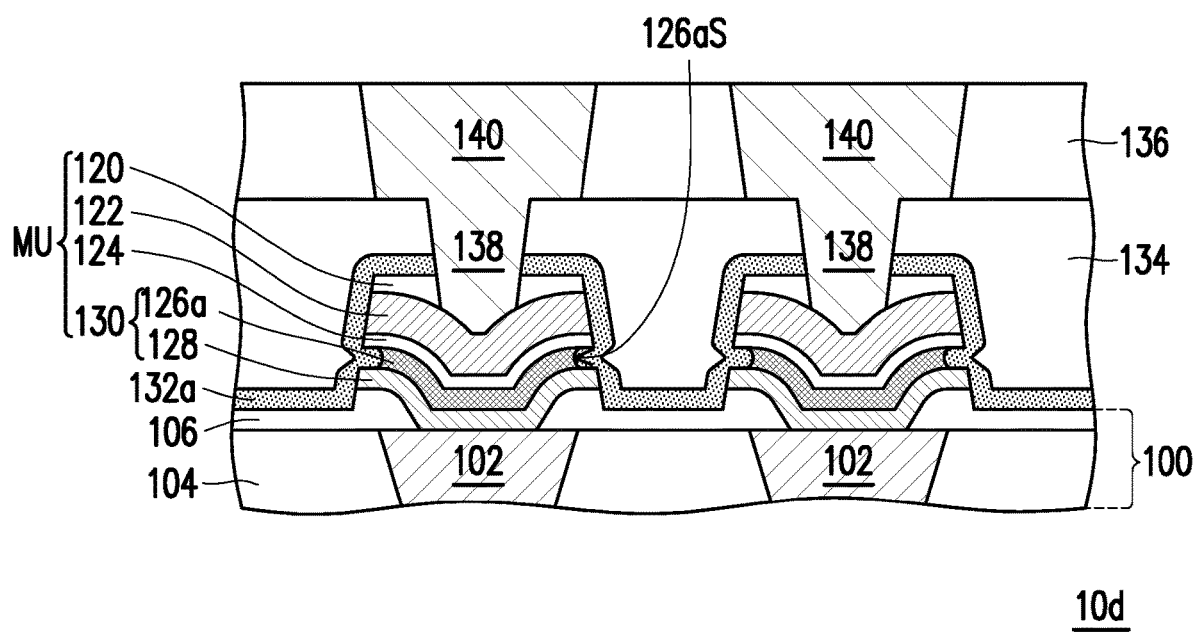

FIG. 6A and FIG. 6B are schematic cross-sectional views illustrating memory devices 10b and 10c according to some embodiments of the present disclosure. The memory devices 10b and 10c shown in FIG. 6A and FIG. 6B are similar to the memory devices 10 and 10a as shown in FIG. 2I and FIG. 4C. Only the differences therebetween will be described, the same or the like parts will not be repeated again.

Referring to FIG. 2I and FIG. 6A, the memory devices 10b shown in FIG. 6A are similar to the memory devices 10 as shown in FIG. 2I, except that air gaps are absent between a passivation layer 132a and the bottom electrodes 126 as shown in FIG. 6A. In some embodiments, the passivation layer 132a fills the cavities defined by the bottom electrodes 126, the overlying resistance variable layers 124 and the underlying bottom electrodes 128, and in physical contact with the sidewalls 126S of the bottom electrodes 126. In these embodiments, a surface of the passivation layer 132a may further have recesses in correspondence to these currently filled cavities. A method for forming the passivation layer 132a as shown in FIG. 6A may include an ALD process.

Referring to FIG. 4C and FIG. 6B, similarly, differences between the memory devices 10c shown in FIG. 6B and the memory devices 10a shown in FIG. 4C lies in that air gaps are absent between the passivation layer 132a and the bottom electrodes 126a as shown in FIG. 6B. In some embodiments, cavities defined by the bottom electrodes 126a, the overlying resistance variable layers 124 and the underlying bottom electrodes 128 are filled by the passivation layer 132a, and the passivation layer 132a is in physical contact with the sidewalls 126aS of the bottom electrodes 126a. In addition, a surface of the passivation layer 132a may be recessed in correspondence to these currently filled cavities. A method for forming the passivation layer 132a as shown in FIG. 6B may include an ALD process.

As above, the memory device according to embodiments of the present disclosure includes a memory unit, which includes a composite bottom electrode, a top electrode and a resistance variable layer sandwiched between the composite bottom electrode and the top electrode. The composite bottom electrode includes a first bottom electrode and a second bottom electrode disposed over the first bottom electrode. The sidewall of the second bottom electrode is laterally recessed and concave from other portions of the memory unit. As a result, an isolation distance from the top electrode to the composite bottom electrode along a sidewall of the memory unit is increased. In addition, during laterally recessing the bottom electrode, possible residue of a conductive material left between the top electrode and the composite bottom electrode may be removed. Therefore, isolation between the top electrode and the composite bottom electrode is improved. As compared with disposing a spacer surrounding the top electrode that a pattern of the composite bottom electrode would be defined by an outer contour of the surrounding spacer, the composite bottom electrode according to embodiments of the present disclosure may have a smaller footprint since it is patterned by using a smaller mask which does not have the surrounding spacer. In this way, the isolation between the top electrode and the composite bottom electrode can be ensured without decreasing a spacing between laterally adjacent memory units (i.e., a spacing between laterally adjacent composite bottom electrodes), thus isolation between laterally adjacent memory units can also be improved. Furthermore, by omitting formation of the above-mentioned spacer, at least one deposition step and at least one etching step could be saved. Accordingly, a manufacturing cost is reduced.

In an aspect of the present disclosure, a memory device is provided. The memory device comprises a composite bottom electrode, a top electrode and a resistance variable layer disposed between the composite bottom electrode and the top electrode. The composite bottom electrode comprises a first bottom electrode and a second bottom electrode disposed over the first bottom electrode. A sidewall of the second bottom electrode is laterally recessed from sidewalls of the first bottom electrode layer and the resistance variable layer.

In another aspect of the present disclosure, a memory integrated circuit is provided. The memory integrated circuit comprises a plurality of memory cells, a plurality of bit lines and a plurality of word lines. The plurality of memory cells are arranged in an array. Each of the plurality of memory cells comprises a memory device, and the memory device comprises a composite bottom electrode, a top electrode, a resistance variable layer located between the composite bottom electrode and the top electrode and a passivation layer covering the top electrode, the resistance variable layer and the composite bottom electrode. The composite bottom electrode comprises a first bottom electrode and a second bottom electrode disposed over the first bottom electrode. A sidewall of the second bottom electrode is laterally recessed from sidewalls of the first bottom electrode and the resistance variable layer. The plurality of bit lines extend along a first direction. The plurality of word lines extend along a second direction, which is intersected with the first direction. Each of the memory devices is electrically connected between one of the plurality of bit lines and one of the plurality of word lines.

In yet another aspect of the present disclosure, a manufacturing method of a memory device is provided. The method comprises: sequentially forming a first bottom electrode layer, a second bottom electrode layer, a resistance variable material layer, a top electrode layer and a hard mask layer over a device substrate; patterning the hard mask layer to form a hard mask; patterning the top electrode layer, patterning the resistance variable material layer, patterning the second bottom electrode layer and patterning the first bottom electrode layer by using the hard mask as a mask; and laterally recessing the second bottom electrode layer from the patterned resistance variable material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a composite bottom electrode;
   a top electrode; and
   a resistance variable layer, disposed between the composite bottom electrode and the top electrode,
   wherein the composite bottom electrode comprises a first bottom electrode and a second bottom electrode disposed over the first bottom electrode, and a sidewall of the second bottom electrode is laterally concave from sidewalls of the first bottom electrode layer and the resistance variable layer.

2. The memory device according to claim 1, further comprising:
   a hard mask, disposed over the top electrode.

3. The memory device according to claim 2, wherein a sidewall of the hard mask is substantially coplanar with a sidewall of the top electrode, the sidewall of the resistance variable layer and a sidewall of the first bottom electrode.

4. The memory device according to claim 1, further comprising:
   a passivation layer, covering the composite bottom electrode, the resistance variable layer and the top electrode.

5. The memory device according to claim 4, wherein the passivation layer is in physical contact with a sidewall of the top electrode.

6. The memory device according to claim 4, wherein the passivation layer is in physical contact with the sidewall of the second bottom electrode of the composite bottom electrode.

7. The memory device according to claim 4, wherein an air gap is located in between the sidewall of the second bottom electrode and the passivation layer.

8. The memory device according to claim 7, wherein the second bottom electrode is surrounded by the air gap.

9. The memory device according to claim 1, wherein the sidewall of the second bottom electrode has a curved surface, and a most concave part of the sidewall of the second bottom electrode is located at a bottom surface of the resistance variable layer.

10. The memory device according to claim 1, wherein the sidewall of the second bottom electrode has a curved surface, and a most concave part of the sidewall of the second bottom electrode is located at around a half thickness of the second bottom electrode.

11. A memory integrated circuit, comprising:
   a plurality of memory cells, arranged in an array, wherein each of the plurality of memory cells comprises a memory device, and the memory device comprises a composite bottom electrode, a top electrode, a resistance variable layer located between the composite bottom electrode and the top electrode and a passivation layer covering the top electrode, the resistance variable layer and the composite bottom electrode, wherein the composite bottom electrode comprises a first bottom electrode and a second bottom electrode disposed over the first bottom electrode, and a sidewall of the second bottom electrode is laterally concave from sidewalls of the first bottom electrode and the resistance variable layer;

a plurality of bit lines, extending along a first direction; and a plurality of word lines, extending along a second direction that is intersected with the first direction, wherein each of the memory devices is electrically connected between one of the plurality of bit lines and one of the plurality of word lines.

12. The memory integrated circuit according to claim 11, wherein the passivation layer is in physical contact with the sidewall of the second bottom electrode of the composite bottom electrode.

13. The memory integrated circuit according to claim 11, wherein an air gap is located in between the sidewall of the second bottom electrode and the passivation layer.

14. The memory integrated circuit according to claim 11, wherein an air gap surrounding the second bottom electrode is located in between the sidewall of the second bottom electrode and the passivation layer.

15. The memory integrated circuit according to claim 11, wherein each of the plurality of memory cells further comprises a transistor, one of a source terminal and a drain terminal of the transistor is electrically connected to the memory device, the other one of the source terminal and the drain terminal is electrically connected to a source line, and a gate terminal of the transistor is connected to one of the plurality of word lines.

16. A manufacturing method of a memory device, comprising:

sequentially forming a first bottom electrode layer, a second bottom electrode layer, a resistance variable material layer, a top electrode layer and a hard mask layer over a device substrate;

patterning the hard mask layer to form a hard mask;

patterning the top electrode layer, patterning the resistance variable material layer, patterning the second bottom electrode layer and patterning the first bottom electrode layer by using the hard mask as a mask; and laterally recessing the second bottom electrode layer from the patterned resistance variable material layer.

17. The manufacturing method of the memory device according to claim 16, wherein one single etching process is performed to pattern the second bottom electrode layer by using the hard mask as the mask and to laterally recess the second bottom electrode layer after patterning the resistance variable material layer and before patterning the first bottom electrode layer.

18. The manufacturing method of the memory device according to claim 16, wherein a first etching process is performed to pattern the second bottom electrode layer by using the hard mask as the mask and a second etching process is performed to laterally recess the second bottom electrode layer, and the first and second etching processes are different etching processes.

19. The manufacturing method of the memory device according to claim 18, wherein the second etching process to laterally recess the second bottom electrode layer is performed before patterning the first bottom electrode layer.

20. The manufacturing method of the memory device according to claim 18, wherein the second etching process to laterally recess the second bottom electrode layer is performed after patterning the first bottom electrode layer.

* * * * *